United States Patent [19]

Shinmyo

[11] 4,297,650
[45] Oct. 27, 1981

[54] PHASE LOCKED LOOP CARRIER RECOVERY CIRCUIT WITH FALSE LOCK PREVENTION

[75] Inventor: Saburo Shinmyo, Tokyo, Japan

[73] Assignee: Nippon Electric Co., Ltd., Tokyo, Japan

[21] Appl. No.: 108,249

[22] Filed: Dec. 27, 1979

[30] Foreign Application Priority Data

Dec. 27, 1978 [JP] Japan ................................. 53-164883

[51] Int. Cl.³ ............................................. H03L 7/10
[52] U.S. Cl. ..................................... 331/11; 329/50; 329/124; 331/12; 331/17; 331/DIG. 2
[58] Field of Search ..................................... 331/10-12, 331/18, 17, 23, 25, DIG. 2; 329/122, 124, 50

[56] References Cited

U.S. PATENT DOCUMENTS 3,768,030 10/1973 Brown et al. .......................... 331/12
4,000,476 12/1976 Walker et al. ..................... 331/25 X Primary Examiner—Siegfried H. Grimm
Attorney, Agent, or Firm—Sughrue, Mion, Zinn, Macpeak and Seas

[57] ABSTRACT

A carrier recovery apparatus for phase modulated waves including phase-locked loops is operable to prevent false locks. The apparatus includes a clock recovery circuit which generates a signal in response to a modulated carrier, a first phase comparator responsive to the modulated carrier and the output of a VCO, a second phase comparator responsive to the first phase comparator and the clock signal, and a control device for superimposing the low frequency component of the output of the second phase comparator on the output of the first phase comparator or a loop filter which controls the VCO.

6 Claims, 3 Drawing Figures

PHASE LOCKED LOOP CARRIER RECOVERY CIRCUIT WITH FALSE LOCK PREVENTION

BACKGROUND OF THE INVENTION

This invention relates to carrier recovery apparatuses for phase-modulated waves including phase-locked loops (PLLs), and more particularly to carrier recovery apparatuses capable of eliminating false locks.

In conventional carrier recovery apparatuses for N-phase phase-modulated waves, the PLLs are generally used to recover a stable carrier. Such carrier recovery apparatuses often have a false lock of the PLL, i.e. a phase-synchronization of the loop with a frequency different from that of an input carrier. The false lock causes the phase of the recovered carrier, which gives a reference phase for the synchronous detection, to be fixed to a value other than the reference. Since frequency beats corresponding to the difference between the reference phase and false-locked phase are superimposed on the demodulated output, normal demodulation is made impossible.

The lock usually occurs when (1) the delay time in the PLL is unignorably long or (2) the PLL is either a sampling-controlled system or equivalent thereto. In most instances, item (2) is a more troublesome factor. The false lock due to item (1) can be avoided by sufficiently reducing the delay time in the PLL. However, an N-phase phase-modulated wave, even in the absence of sampling control, is inevitably subjected to the false lock to some extent. The false lock can only be averted at the sacrifice of PLL performance, for instance by decreasing the loop gain. Thus, the false lock affects substantially the stability of the carrier recovery apparatus.

A false lock due to the item (2) arises at a frequency offset linked to the modulation rate (sampling frequency $f_s$), and generally occurs at a frequency $\pm m/n\, f_s$ (where m and n are integers, and m/n is irreducible) apart from the input carrier frequency ($f_o$). N-phase phase-demodulated waves are more susceptible to false locks at a frequency offset of $\pm m/N\, f_s$ (where m is a positive integer), particularly so when m equals 1. Consequently, affected by the adjoining false locks, a desired lock range may be narrowed, or even reversed in extreme cases. This is particularly conspicuous in the instances of increased phases or decreased modulation rate, where the desired lock range cannot be secured, resulting in a serious impediment to loop design.

One conceivable way to avoid such false lock is to detect an automatic phase control (APC) signal of the PLL with a beat detector or the like, distinguish between the desired and false locks according to this detection output, give a sweep voltage to a voltage-controlled oscillator (VCO) of the PLL for a certain period of time, and thereby lead the loop into a desired synchronized state. However, since this method depends on the detection of the noise level of the APC signal for distinguishing between the desired and false locks, it is difficult to determine the noise level difference, on account of frequency pattern jitters, where the input phase-modulated wave is a multi-phase modulated wave subjected to strict band restriction (for instance, roll-off shaping). Nor is stable detection possible where the signal to noise (S/N) ratio of the input is low. Moreover, the sweep voltage to control the VCO has to cover both the positive and negative ranges because it is impossible to determine whether the frequency offset of the false lock is positive or negative. Therefore, the method takes an unnecessarily long time for locking and requires a complex control circuit to generate the sweep signal, which involves a reliability problem on account of its complexity.

Besides this method, there is another control circuit utilizing the impedance difference between the synchronized and unsynchronized states of the phase synchronization loop as viewed from outside (see U.S. Pat. No. 4,121,166). The control circuit has a low-frequency oscillator in addition to the VCO in the PLL. When a signal from the low-frequency oscillator is injected into the PLL, it causes the VCO to sweep and expand the range of synchronization as the internal impedance of the loop is high when it is in an unsynchronized state. In a synchronized state, on the other hand, since the internal impedance of the loop is reduced and the injected signal is sufficiently compressed within the PLL, the injected signal will not affect the PLL. When an undesired synchronized state is caused by the false lock, any distinction between the desired and undesired synchronized state cannot be made because the internal impedance of the PLL drops even in the case of the undesired synchronized state. To avoid the undesired state, the low-frequency sweep circuit is actuated after a synchronized state has been recognized as opposed to an unsynchronized state, and a control voltage sweep of the VCO is continued for a certain period of time so that the desired synchronized state, out of the range of the false lock, can be stably attained.

This system, which cannot distinguish the undesired from the desired state, requires a sweep circuit separately from the low-frequency oscillator and, moreover, precise setting of the optimum sweep range, with the PLL parameter taken into account, so that the lock range of the desired synchronized state cannot be deviated from. This circuit involves another problem in that the complexity of its control means substantially affects the overall stability of the carrier recovery apparatus. Furthermore, it is impossible for the circuit to determine the polarity of the sweep, which has to be achieved at a sufficiently low frequency, resulting in an extremely long lock period.

BRIEF DESCRIPTION OF THE INVENTION

The object of the present invention, accordingly, is to solve these problems and provide a carrier recovery apparatus which is capable of obtaining a sufficiently stable reference carrier even from a stringently band-restricted multi-phase modulated wave.

In accordance with this invention, there is provided a carrier recovery apparatus comprising an input terminal for receiving a phase-modulated input carrier, a VCO for generating a variable frequency oscillation in response to a control signal, a first phase comparator for providing a comparison output representative of the phase difference between the modulated input carrier and the output of the VCO, a loop filter for supplying the VCO with the low-frequency component of the output of the first phase comparator as a control signal for the VCO, a clock recovery circuit for generating a clock signal in response to the modulated input carrier, a second phase comparator for providing a comparison output representative of the phase difference between the output of the first phase comparator and the clock signal, and means for superimposing the low-frequency component of the output of the second phase comparator on the output of the first phase comparator or the loop filter.

BRIEF DESCRIPTION OF THE DRAWINGS

The characteristics and advantages of the present invention will become more apparent from the following description taken in conjunction with the accompanying drawings wherein.

DETAILED DESCRIPTION OF THE INVENTION

Figure 1:
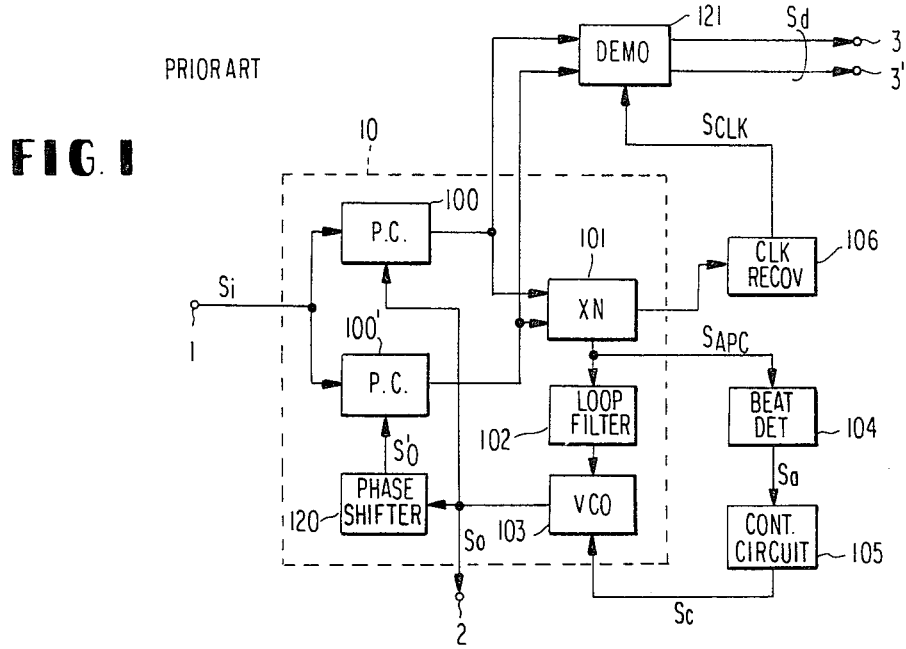
FIG. 1 is a block diagram of a prior art arrangement of a four-phase phase-modulated wave demodulator.

In the carrier recovery circuit of the demodulator illustrated in FIG. 1, there is used a base band N-fold frequency multiplication system (N is positive integer). An N-phase phase-modulated wave $S_i$, fed to an input terminal 1, is synchronously detected by phase comparators 100 and 100' with reference to an output $s_o$ of a VCO 103 and a signal $S_o'$ obtained by phase-shifting the output $s_o$ by $\pi/2$ with a phase shifter 120. This synchronously detected signal is multiplied by N by an N-fold frequency multiplier 101 to become an APC signal $S_{APC}$, which, after being low-pass filtered by a loop filter 102, is fed back to the VCO 103. The VCO 103, varying its oscillation frequency in response to the fed-back signal voltage, supplies its output $s_o$ to the phase comparator 100 and the $\pi/2$ phase shifter 120. The outputs of the phase comparators 100 and 100' are regenerated by code regenerator 121 and read out in response to a clock signal $S_{CLK}$ from a clock recovery circuit 106 to become a demodulated output $s_d$, which is emitted as outputs from output terminals 3 and 3'. Further, to avoid a false lock of a PLL 10 in this demodulator, the output $S_{APC}$ of the N-fold frequency multiplier 101 is beat-detected by a beat detector (for instance an envelope detector).

Now supposing the PLL 10 is false-locked, a beat voltage equal to N times the frequency offset of the false lock is superimposed on the APC signal $S_{APC}$ and detected as a noise component by a beat detector 104. This detection is achieved by distinguishing between a desired lock and a false lock or a synchronization at a certain threshold value, and the detected result is supplied to a control circuit 105 (composed of, for instance, a pulse generator, a counter and a digital-analogue converter). On the basis of the signal so supplied, the control circuit 105 generates a control signal, which may be a symmetrical triangular wave for example, and with this control signal is swept the input voltage of the VCO 103 for a predetermined period of time. Incidentally, a carrier recovery circuit containing a PLL generally includes among its structural elements a phase comparator, a loop filter and a VCO, which is controlled with an APC signal from the phase comparator. If the function of this negative feedback loop is to be taken note of, the PLL 10 in FIG. 1 can be replaced with one of an intermediate frequency (IF) signal N-fold frequency multiple type or a reverse modulation-demodulation type. Since conventional carrier recovery circuits thus avert false lock by detecting the noise level of the APC signal $S_{APC}$, they have the aforementioned disadvantages.

Figure 2:
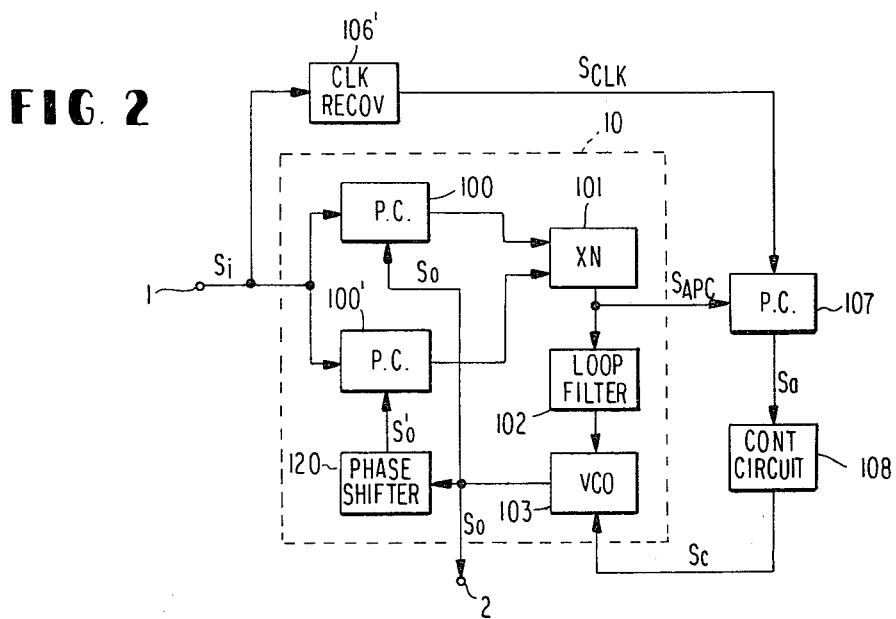
FIG. 2 is a block diagram of a carrier recovery circuit in accordance with this invention.

FIG. 2 is a block diagram of an embodiment of the present invention wherein blocks to which the same reference numerals are assigned have the same functions as the respectively corresponding ones in FIG. 1. If the PLL 10 is falsely locked at a frequency offset of $\pm f_s/N$, the APC signal supplied by the N-fold frequency multiplier 101 will have a clock frequency component of $\pm f_s$. Therefore, when the APC signal $S_{APC}$ is phase-compared by a phase comparator 107 with the clock signal $S_{CLK}$ extracted from the input wave $S_i$ by a clock recovery circuit 106' (see, for instance, Floyd M. Gardner, "Phaselock Techniques", pp. 117–119, John Wiley & Sons 1966) and the D.C. component thereof, an output $S_a$, is picked out, different voltages can be detected from the output $S_a$ depending on whether desired lock or false lock at a frequency offset of $\pm f_s/N$ has taken place. The clock signal $S_{CLK}$ can as well be recovered from the output of the N-fold frequency multiplier 101 like in the arrangement of FIG. 1.

Next, the actions referred to in FIG. 2 will be represented in equations hereunder.

N-phase phase-modulated input wave $S_i: V_i = A \sin[\omega_i t + \phi(t)]$ where $\omega_i$ is the angular frequency of the carrier, $\phi(t)$ is the base band phase signal, $$\phi(t) = \Sigma \frac{2\pi}{N} a_i U(t - iT) + \phi_o$$

$a_i$ is the base band symbol $(0 \sim N-1)$ and $U(t)$ is the impulse response of the modulation-demodulation system.

Recovered carrier $S_o: V_o = B \sin[\omega_o t + \phi]$ where $\omega_o$ is the angular frequency oscillation.

The above being assumed:

APC signal $S_{APC}: V_{APC} = C \cos[N\Delta\omega t + N\Delta\psi]$ where $\Delta\omega = \omega_i - \omega_o$, $\Delta\psi = \phi(t) - \phi$ Recovered clock signal $S_{CLK}: V_{CLK} = D \sin[\omega_s t + \theta]$ where $\omega_s$ is clock angular frequency.

Phase comparator output $S_a: \overline{V} = \overline{V_{APC} \cdot V_{CLK}} =$ $\overline{E \sin[(\omega_s + N\Delta\omega)t + \theta + N\Delta\psi]} +$ $\overline{E \sin[(\omega_s - N\Delta\omega)t + \theta - N\Delta\psi]}$ where ( ‾ ) indicates an average. Thus the voltage V of the phase comparator output $S_a$ will be:

(A) In a desired lock: $\Delta\omega = 0$, hence $V = 0$, or (B) In a false lock: $\Delta\omega = \pm\omega_s/N$, hence $V = \overline{E \sin[\theta \mp N\Delta\psi]}$ Therefore, by selecting either $\theta = 0$ or $\theta = \pi$ by appropriately adjusting the phases of the clock signal and the APC signal, three values of the signal $S_a$, i.e., O and $\pm E \sin[N\Delta\psi]$, can be caused to correspond to the desired lock and false locks at $\pm f_s/N$, respectively, so that the desired lock and false locks can be distinguished from each other, and the polarity determined to be positive or negative, by identifying the value of the signal $S_a$.

This output $S_a$ of the phase comparator 107 undergoes ternary identification in a control circuit 108 and, in the case of false lock, is supplied to the VCO 103 as a control signal $S_c$ from the control circuit 108, separately from the regular control signal in the APC loop 10. The oscillation frequency of the VCO 103 is forced by the control signal $S_c$ to alter to the desired lock side and is thereby released from false lock to enter the desired lock range, which is accordingly expanded.

Figure 3:
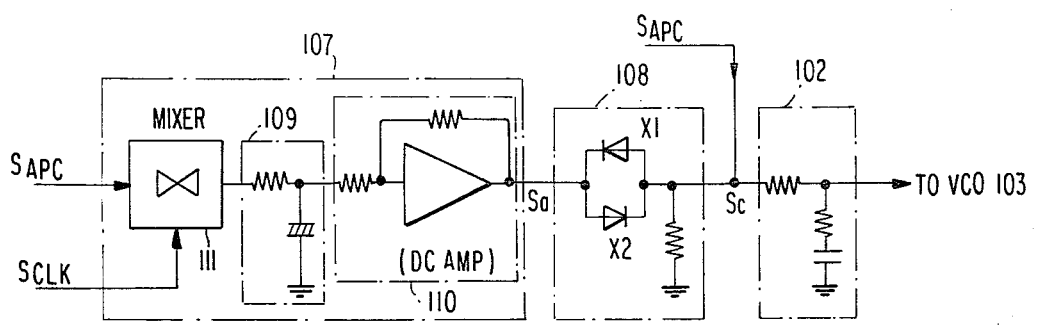
FIG. 3 is a circuit diagram of part of the circuit shown in FIG. 2.

FIG. 3 illustrates detailed examples of the phase comparator 107 and the control circuit 108 in conformity with this invention. The APC signal $S_{APC}$ and the recovered clock signal $S_{CLK}$ are subjected to phase comparison by a mixer 111, whose output is filtered by a simple RC filter 109 and amplified by a D.C. amplifier 110. The output $S_a$ has a voltage of 0 in the desired lock, or $\pm V$ in the false lock at $\pm f_s/N$. The control circuit 108, which consists of diodes X1 and X2, has a high impedance in the desired lock (the voltage of $S_a=0$) and accordingly does not affect an ordinary carrier recovery circuit, but in the false lock (the voltage of $S_a=\pm V$) the impedance of either the diode X1 or X2 drops to give a certain bias to the APC signal $S_{APC}$. If the polarity of this bias given to the APC signal $S_{APC}$ is selected on the synchronization side, the loop will be forcibly released from the false lock and swung to the synchronization side, resulting in an expanded range of desired lock.

Although the control signal $S_c$ is fed to the loop filter 102 iin FIG. 3, alternatively it can be directly applied to the VCO 103 as illustrated in FIG. 2. FIG. 3 shows but one of the simplest examples of conceivable control circuit, and many other versions are conceivable. For instance, to further ensure the desired lock, the control circuit 108 can be supplemented with a circuit to hold the control signal $S_c$, which controls the VCO 103 in a false lock, for a period of time not shorter than the time constant determined by the loop characteristic, so that the synchronization range can be expanded to the holding range of the desired lock.

Since the phase of the clock component emerging in the APC signal $S_{APC}$ in the false lock is thus compared with that of the separately extracted clock signal $S_{CLK}$, the false lock detection is reliable, and a control loop having a sufficiently high distinguishing sensitivity for practical use can be obtained even from a multi-phase or stringently band-restricted modulated wave. Moreover, because it is possible to identify the polarity of the frequency offset of false lock, controls in unnecessary polarities are eliminated, resulting in a shortened lock time. It is further possible, if required, to improve the distinction sensitivity by sampling the APC signal $S_{APC}$ or the phase comparator output $S_a$ with the clock signal $S_{CLK}$.

Although the foregoing description refers to a carrier recovery circuit of the base band N-fold frequenty multiple type, the carrier recovery apparatus according to this invention can also be effective in other systems of demodulation such as the intermediate frequency N-fold multiple method, and the reverse modulation-remodulation method as long as they contain a PLL. In these systems, as in the base band N-fold multiple method, false lock of the PLL can be avoided by phase-comparing the APC signal and the recovered clock and controlling the oscillation frequency of the VCO with the voltage of the comparison output.

As heretofore described, the present invention makes it possible to avert false lock and expand the desired lock range by merely adding a simple circuit to a conventional carrier recovery apparatus and, moreover, it provides a sufficiently stable recovery function even under a stringent band restriction, in a multi-phase situation or at poor input signal to noise ratio. Accordingly, this invention can give a wider choice to the designs of carrier recovery apparatuses.

What is claimed is:

1. A carrier recovery apparatus comprising an input terminal for receiving a phase-modulated carrier, a voltage-controlled oscillator for generating a variable frequency oscillation in response to a control signal, a first phase comparator for providing a comparison output representative of the phase difference between said modulated carrier and the output of said voltage-controlled oscillator, a loop filter for supplying said voltage-controlled oscillator with the low-frequency component of the output of said first phase comparator as said control signal, a clock recovery circuit for generating a clock signal in response to said modulated carrier, a second phase comparator for providing a comparison output representative of the phase difference between the output of said first phase comparator and said clock signal, and means for superimposing the low-frequency component of the output of said second phase comparator on one of the outputs of said first phase comparator and said loop filter.

2. A carrier recovery circuit as claimed in claim 1 wherein said second phase comparator comprises a mixer for mixing said clock signal and said comparison output from said first phase comparator, and a low pass filter for passing to an output thereof the low frequency component of said mixer whereby said low frequency component indicates the existence of and direction for correction of a false phase lock in said carrier recovery apparatus.

3. A carrier recovery circuit as claimed in claim 1 or 2 wherein said low frequency component is superimposed on the output of said loop filter.

4. A carrier recovery circuit as claimed in claim 1 or 2 wherein said first phase comparator includes a multiplier means for multiplying said comparison output from said first phase comparator by N where N is the number of distinct phases in the phase modulated carrier.

5. A carrier recovery circuit as claimed in claim 4 wherein said low frequency component is superimposed on the output of said multiplier means.

6. A carrier recovery apparatus as claimed in claim 1 or 2, wherein said means for superimposing has a high impedance when the carrier recovery apparatus is in the desired phase locked condition, and a lower impedance when the carrier recovery apparatus is in a false phase locked condition.

* * * * *

UNITED STATES PATENT AND TRADEMARK OFFICE
CERTIFICATE OF CORRECTION

PATENT NO. : 4,297,650
DATED : October 27, 1981
INVENTOR(S) : Saburo SHINMYO

It is certified that error appears in the above—identified patent and that said Letters Patent is hereby corrected as shown below:

Column 4, line 55, delete "$E\sin[N\Delta\Psi]$" and insert -- $\overline{E\sin[N\Delta\Psi]}$ --

Signed and Sealed this

*Twenty-first* Day of *June 1983*

[SEAL]

*Attest:*

DONALD J. QUIGG

*Attesting Officer*     *Acting Commissioner of Patents and Trademarks*